United States Patent
Lai et al.

[11] Patent Number: 5,937,876
[45] Date of Patent: Aug. 17, 1999

[54] RINSING SYSTEM USED IN A PHOTORESIST COATER WITH CAPABILITY TO AVOID A REVERSED PRESSURE EFFECT

[75] Inventors: Kuei-Hsi Lai; Ching-Chih Cheng, both of Hsinchu Hsien; Hung-Lung Ma, Miao-Li Hsien, all of Taiwan

[73] Assignee: United Microelectronics Corp., Hsinchu, Taiwan

[21] Appl. No.: 09/185,399

[22] Filed: Nov. 3, 1998

[51] Int. Cl.⁶ ........................................................ B08B 3/08
[52] U.S. Cl. ........................ 134/56 R; 134/195; 134/110; 210/136; 210/143; 210/418; 210/416.1
[58] Field of Search ................... 134/56 R, 186, 134/195, 110, 111, 201; 210/136, 143, 418, 416.1, 137, 33.1, 188

[56] References Cited

U.S. PATENT DOCUMENTS

| | | | |
|---|---|---|---|
| 3,990,953 | 11/1976 | Austin | 204/114 N |
| 4,899,767 | 2/1990 | McConnell | 134/56 R |
| 4,919,154 | 4/1990 | Engle | 134/22.12 |
| 5,377,708 | 1/1995 | Bergman | 134/105 |
| 5,651,379 | 7/1997 | Mohindra | 134/95.2 |
| 5,816,502 | 10/1998 | Sperry | 239/304 |
| 5,887,606 | 3/1999 | Tsou | 134/166 R |

*Primary Examiner*—Frankie L. Stinson
*Assistant Examiner*—Mialeeka C. Williams-Bibbs
*Attorney, Agent, or Firm*—Knobbe, Martens, Olson & Bear LLP

[57] ABSTRACT

A rinsing system used in a photoresist coater to remove a brim portion of the formed photoresist layer on a substrate. The rinsing system has capability to avoid a reversed pressure effect. The rinsing system includes several distribution ducts, which are coupled to a solvent container. Each duct includes an one-way valve, an automatically-releasing-gas filter, and a pump with sequential couplings from the solvent container. The pump is used to transport solvent to the substrate to rinse the photoresist layer. The pump also induces the reversed pressure effect, which can be avoided by the automatically-releasing-gas filter, the one-way valve, and the solvent container. The one-way valve includes a spring to hold a ball-like stopper of the valve so that the reversed pressure effect is consumed by the spring force. The automatically-releasing-gas filter contains a gas and includes a releasing-gas valve to release the gas. The solvent container also contain a gas with a pressure of about one atmospheric pressure. The reversed pressure effect is reduced by the pressure induced by the gases.

14 Claims, 2 Drawing Sheets

RINSING SYSTEM USED IN A PHOTORESIST COATER WITH CAPABILITY TO AVOID A REVERSED PRESSURE EFFECT

BACKGROUND OF THE INVENTION

1. Field of the Invention

This invention relates to a semiconductor fabrication equipment, and more particularly to a rinsing system used in a photoresist coater with capability to avoid a reversed pressure effect.

2. Description of Related Art

Photolithography plays an essential role in semiconductor fabrication. All semiconductor devices need several photolithography process to transfer desired patterns so as to form the devices as designed. A semiconductor device usually includes, for example, a transistor structure with proper doping regions, a capacitor, and an interconnecting structure for connection between each component. All these needs several different photolithography processes. A more complex structure accordingly needs more photolithography processes.

The detailed photolithography technology is usually complicated but its theory is straightforwardly simple. Generally, a photoresist layer is coated on a device substrate surface, on which a device is fabricated. The photoresist layer then is exposed by a light source through a photomask, which carries a pattern to be transferred onto the device substrate surface. The photoresist layer includes photo-sensitive material that can be exposed to light to selectively change its material property. After development, the remaining photoresist layer on the device substrate surface forms the desired pattern. The desired pattern therefore is transferred to the device substrate. Up to this stage, the photolithography process is done. A subsequent process, such as etching or doping, are performed to form one sub-structure of the device, which usually includes several different sub-structures. So, a more complex structure accordingly needs more photolithography processes.

The photoresist layer are usually formed by a spin coating process so as to obtain its thickness uniformity and adhesion without defects. After the photoresist layer is formed over a substrate, in order to conveniently move the substrate, a portion of the photoresist layer is rinsed away so as to leave a place to be clipped by moving machine. Usually, the brim of the photoresist layer is necessarily rinsed away or even the back-side of the substrate is also rinsed. An OK-82 solvent is a typical solvent for the purpose of rinse.

FIG. 1 is a schematic architecture of a conventional rinsing system used in a photoresist coater. In FIG. 1, a solvent container 10 contains OK-82 solvent. The solvent is transported to a solvent distributor 12 through a duct 11. The solvent distributor 12 has several distribution ducts 13, 14, 15, 16, 17, and 18, all of which are identical. The distribution ducts 17 and 18 are, for example, used for descriptions. On the distribution duct 17, there is a pump 19 used to transport solvent to a substrate 24 to rinse the brim of a photoresist layer (not shown) on the substrate 24, which is held by a spinner 23. The distribution duct 17 also has a filer 20, which is located before the pump 19, used to have a pure solvent without particles. Solvent is thereby transported to a duct end 22 to rinse the brim or the backside of the substrate 24.

When the pump 19 is activated, an inner cylinder 25 of the pump 19 provides a transporting force of solvent. Inside the pump 19, there are two valves corresponding to an input end 26 and an output end. When solvent inside the pump 19 is pressurized, solvent flows out to the duct end 22. However, if the pumping frequency of the inner cylinder 25 is too fast, a ball-like stopper 27 of the valve at the input end 26 may not shift to the proper place in time to seal the input end 26 while solvent is pressurized. In addition, even in a case that the stopper 27 can shift to the proper place in time, the stopper 27 still may not seal the vale at the input end 26 due to a possibility of bad sealing contact. In this situation, solvent can flow backward along a reversed direction 29. This is called a reversed pressure effect. The flowing back solvent further flows back to the solvent distributor 12 and causes a problem.

Although the filter 20 has a regulating valve 30, which can be adjusted by hand, to prevent the flowing back solvent from further flowing back to the solvent distributor 12, it practically is very difficult to have a proper adjustment in time. Because the distance between the solvent distributor 12 and the filter 20 is short, the flowing back solvent may pass through the solvent distributor 12 and flows to the distribution duct 18. The flowing back solvent then passes the distribution duct 18 and rinses a substrate 35, resulting in a damage to a photoresist layer (not shown) formed on the substrate 35. If the flowing back solvent is too strong, a few of distribution ducts may be very possible affected. If the reversed pressure effect is not effectively reduced, it must cause damages to many substrates on the other distribution ducts.

In summary, because the conventional rinsing system has no effective capability to stop the flowing back solvent flowing back to the solvent distributor, the flowing back solvent can flow two other distribution ducts to cause a damage to the substrates.

SUMMARY OF THE INVENTION

It is therefore an objective of the present invention to provide a rinsing system having an device to effectively avoid an affection of the reversed pressure effect to the other distribution ducts, or even totally avoid the affection.

In accordance with the foregoing and other objectives of the present invention, a rinsing system used in a photoresist coater is provided. The rinsing system includes several distribution ducts coupled to a solvent container. Each of the distribution ducts includes a pump used for transporting solvent to rinse a substrate, and an automatically-releasing-gas filter and an one-way valve both used to effectively avoid a flowing back solvent induced by the reversed pressure effect. The coupling architecture is following.

The solvent container containing solvent and gas is separately coupled to each distribution duct. The gas is used to reduce the reversed pressure effect. The one-way valve is coupled to the solvent container from its input end and is coupled to an output end of the automatically-releasing-gas filter from its output end. The automatically-releasing-gas filter is coupled to an input end of the pump from the output end of the automatically-releasing-gas filter. An output end of the pump is extended to a substrate through the distribution duct. Each distribution duct in the system reduces the reversed pressure effect sequentially through the automatically-releasing-gas filter, the one-way valve, the solvent container, and the one-way valves belonging to the other distribution ducts. Since the solvent container also contains the gas, the solvent container has an effect to reduce the reversed pressure effect. The one-way valve further includes a spring to hold a ball-like stopper of the one-way valve from behind. The one-way valve can reduce most of the reversed pressure effect. Moreover, the spring force is induced by the flowing back solvent, which shift the stopper, so that the reversed pressure effect is further consumed by the spring.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention introduces an one-way valve with a spring to hold the ball-like stopper of the one-way valve so as to reduce a reversed pressure effect but allows a forwardly normal distribution of solvent. The spring further consumes the reversed pressure effect. Moreover, the invention includes a gas serving as a buffer function. The reversed pressure effect thereby is reduced by several stages.

Figure 1:
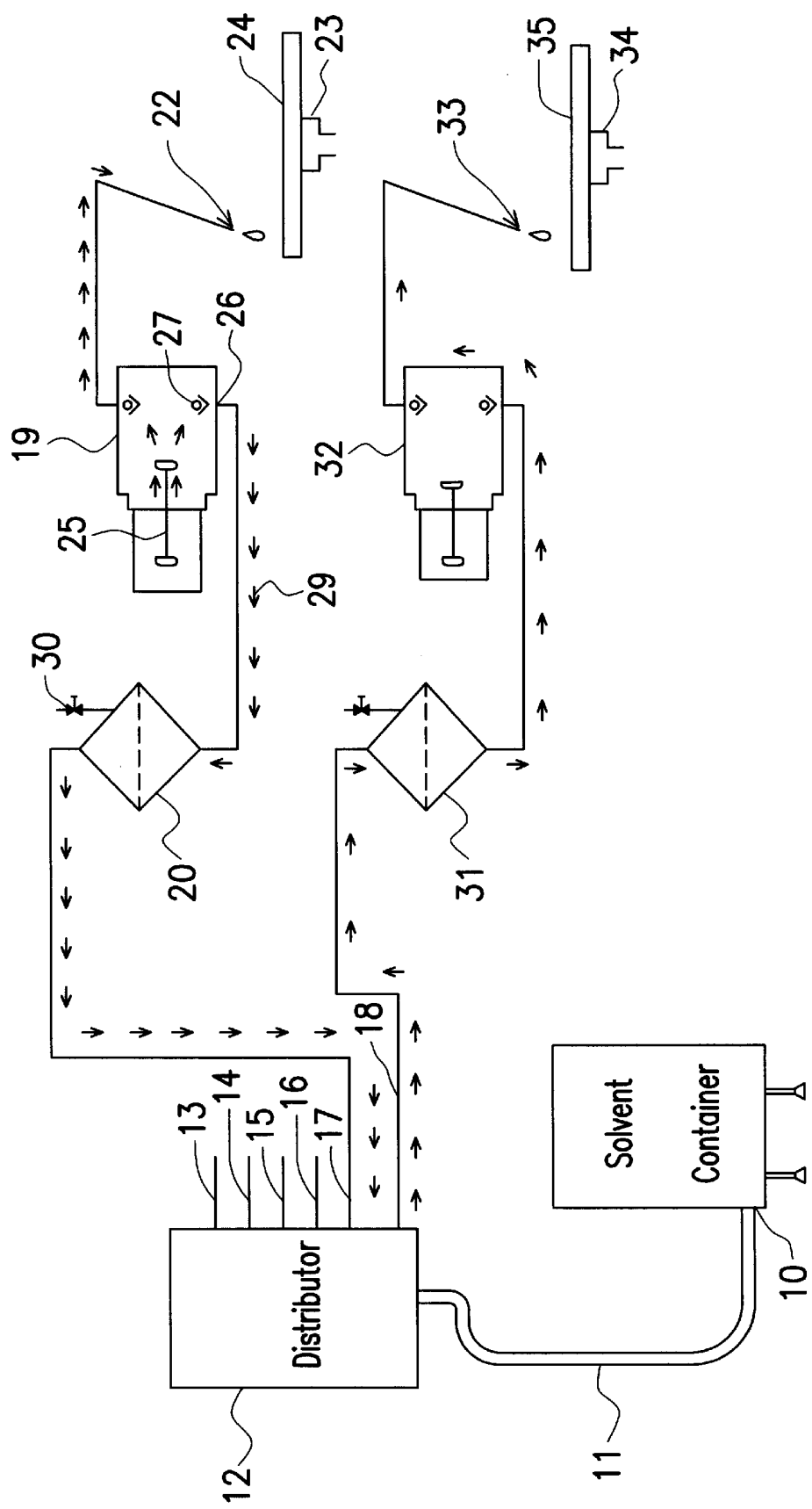
FIG. 1 is a schematic architecture of a conventional rinsing system used in a photoresist coater.
Figure 2:
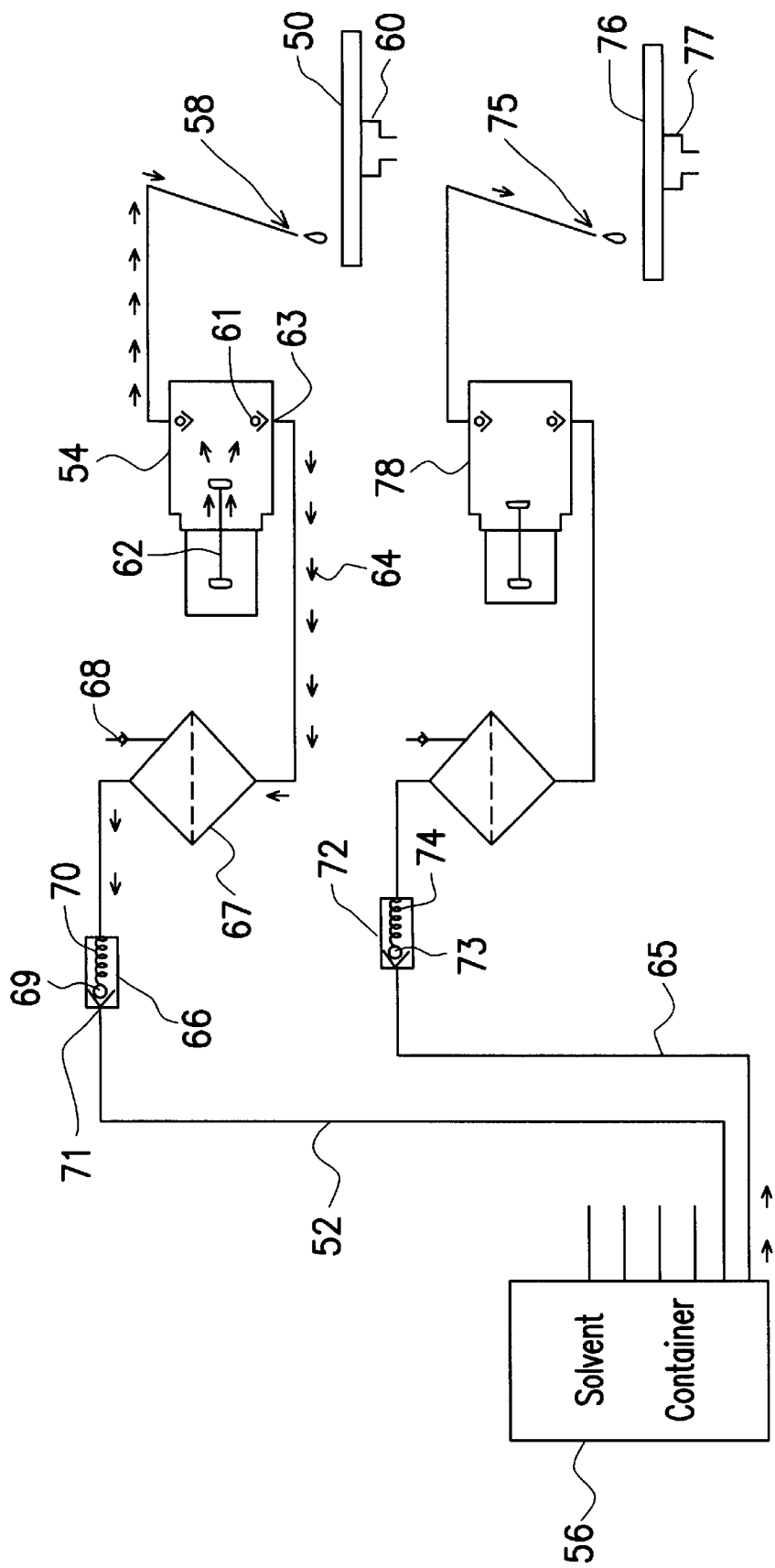
FIG. 2 is a schematic architecture of a rinsing system used in a photoresist coater, according to a preferred embodiment of the invention.

FIG. 2 is a schematic architecture of a rinsing system used in a photoresist coater, according to a preferred embodiment of the invention. In FIG. 2, an improved rinsing system used in a photoresist coater, such as a DNS636 coater has a property of avoidance of the reversed pressure effect. The DNS636 coater has six distribution ducts, which are identical. The distribution ducts are coupled to a solvent container 56, which contains solvent, such as OK-82 solvent, and a gas with a preferred pressure of about one atmospheric pressure. The distribution ducts 52 and 65 are, for example, used for descriptions. On the distribution duct 52, there is a pump 54 used to transport solvent to a substrate 50 to rinse the brim of a photoresist layer (not shown) on the substrate 50 or the backside of the substrate 50. The substrate 50 is held and rotated by a spinner 23. As mentioned in previous descriptions, the purpose of the rinsing system is to obtain a place on the substrate, on which place the substrate 50 can be, for example, clipped by machine for a convenient purpose of move. The distribution duct 52 also has an automatically-releasing-gas filter 67 and an one-way valve 66. The coupling order is from the solvent container 56, the one-way valve 66, the automatically-releasing-gas filter 67, and the pump 54. The distribution duct 52 is extended to the substrate 50. The solvent is thereby transported to a duct end 58 to rinse the brim or the backside of the substrate 50.

When the pump 54 is activated, an inner cylinder 62 of the pump 54 provides a transporting force of solvent. Inside the pump 54, there are two valves corresponding to an input end 63 and an output end. When solvent inside the pump 54 is pressurized, solvent flows out to the duct end 58. However, if the pumping frequency of the inner cylinder 62 is too fast, a ball-like stopper 61 of the valve at the input end 63 may not shift to the proper place in time to seal the input end 63 while solvent is pressurized. In addition, even in a case that the stopper 61 can shift to the proper place in time, the stopper 61 may still cannot seal the vale at the input end 63 due to a possibility of bad sealing contact. In this situation, solvent can flow backward along a reversed direction at the input end 63. A reversed pressure effect then occurs. If the flowing back solvent 64 is not effectively reduced, it may further flow back to the solvent container 56 and flow to the other substrates belonging to the other distribution ducts, such as the substrate 76 of the distribution duct 65. This results in a damage to the substrates.

In order to solve the reversed pressure effect to avoid an affection, for example, on the distribution duct 65, the invention introduces the solvent container 56 which not only contains the solvent but also contain a gas with a pressure of, for example, about one atmospheric pressure. The gas can reduce the reversed pressure effect. The one-way valve 66 includes a spring 70 to hold a ball-like stopper 69 at its input end 71. The spring force can consume the reversed pressure effect. The automatically-releasing-gas filter 67 contains gas, such as air, and has a releasing-gas valve 68, which can reduce the reversed pressure effect by automatically releasing the pressurized gas through the releasing-gas valve 68.

When the reversed pressure effect occurs at the pump 54, the flowing back solvent 64 is induced. The flowing back solvent 64 first flows into the automatically-releasing-gas filter 67, which contains gas to produce a pressure which reduces the flowing back solvent 64. The crested pressure is controlled by the releasing-gas valve 68 through releasing the gas in the automatically-releasing-gas filter 67. The remaining flowing back solvent 64 continues to flow into the one-way valve 66. The stopper 69 is pushed by the remaining flowing back solvent 64 so as to seal input end 71 of the one-way valve 66. The remaining flowing back solvent 64 is generally stopped. Moreover, since the spring 70 holds the stopper 69, a spring force against to the remaining flowing back solvent 64 is created. The flowing back solvent 64 thereby is further consumed away. After the one-way valve 66, the remaining flowing back solvent 64 has been significantly reduced. If there is any remained, the remaining flowing back solvent 64 flows into the solvent container 56 again. Since the solvent container 56 also contains gas with a pressure of, for example, about one atmospheric pressure, which further reduces the remaining flowing back solvent 64. If it is still has some remaining flowing back solvent 64, the remaining flowing back solvent 64 can flow out again through the other distribution ducts, such the distribution duct 65. The remaining flowing back solvent 64 then flows into the one-way valve 72 of the distribution duct 65. Again, a spring force is induced against to the remaining flowing back solvent 64, which is further again reduced. At this stage, the flowing back solvent 64 must be effectively reduced or even completely reduced. The automatically-releasing-gas filter after the one-way valve 72 may further reduce or never reduce the remaining flowing back solvent 64.

In this coupling architecture of the invention, the coupling order of the automatically-releasing-gas filter 67 and the one-way valve 66 can also be reversed. It still has the capability of avoiding the reversed pressure effect.

In conclusion, the invention introduces a one-way valve with a spring to hold the ball-like stopper of the one-way valve so as to generally reduce the reversed pressure effect and further consume the reversed pressure effect by spring force. Moreover, the invention includes gases in an automatically-releasing-gas filter 67 and the solvent container 56 to further reduce the reversed pressure effect. The reversed pressure effect thereby is effectively or completely reduced by several reducing stages.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A rinsing system used in a photoresist coater, the rinsing system comprising:
    a solvent container, which contains a solvent and a first gas, which is used to reduce a reversed pressure effect;
    a plurality of ducts, each of which is coupled to the solvent container and comprises a pump used to transport the solvent to a substrate, wherein the pump also may induce the reversed pressure effect on the ducts;
    a plurality of one-way valves, each of which is coupled on one of the ducts between the solvent container and the pump; and
    a plurality of automatically-releasing-gas filters, each of which is coupled on one of the ducts between the one-way valve and the pump, in which the automatically-releasing-gas filters contain a second gas;
    wherein the solvent container, the one-way valves, the automatically-releasing-gas filters can reduce the reversed pressure effect, and each of the ducts comprises a reduction of the reversed pressure effect by a sequential order of the automatically-releasing-gas filters, the one-way valves, the solvent container, and the others of the one-way valves, which belong to the ducts other than an individual one of the ducts inducing the reversed pressure effect.

2. The system of claim 1, wherein each of the automatically-releasing-gas filters further comprises a releasing-gas valve, which is used to maintain a pressure inside the automatically-releasing-gas filter and releases the second gas.

3. The system of claim 1, wherein each of the one-way valves further comprises a spring to hold a ball-like stopper, which can seal an input of the one-way valve.

4. The system of claim 3, wherein the ball-like stopper is moved by the reversed pressure effect so as to seal the input of the one-way valve to reduce the reverse pressure effect.

5. The system of claim 3, wherein the spring produce a spring force against to the reversed pressure effect so that the reversed pressure effect is further reduced.

6. The system of claim 1, wherein the first gas contained in the solvent container comprises air.

7. The system of claim 6, wherein the first gas has a pressure of about one atmospheric pressure.

8. The system of claim 1, wherein the number of the ducts is six.

9. The system of claim 1, wherein the solvent is used to rinse away a portion of a photoresist layer formed by the photoresist coater.

10. The system of claim 9, wherein the solvent comprises OK-82.

11. The system of claim 9, wherein the portion of the photoresist layer is the brim portion.

12. The system of claim 9, wherein the portion of the photoresist layer is the back-side of the substrate.

13. The system of claim 1, wherein the second gas contained in the automatically-releasing-gas filter comprises air.

14. The system of claim 1, wherein the coupling order of the one-way valve and the automatically-releasing-gas filter can be reversed.

* * * * *